(12) United States Patent
Austerschulte

(10) Patent No.: US 8,242,746 B2
(45) Date of Patent: Aug. 14, 2012

(54) METHOD AND DEVICE FOR MEASURING CELL VOLTAGES IN A PLURALITY OF SERIES-CONNECTED ACCUMULATOR CELLS

(75) Inventor: Burkhard Austerschulte, Amelinghausen (DE)

(73) Assignee: Andreas Stihl AG & Co. KG, Waiblingen (DE)

( * ) Notice: Subject to any disclaimer, the term of this patent is extended or adjusted under 35 U.S.C. 154(b) by 316 days.

(21) Appl. No.: 12/682,967

(22) PCT Filed: Oct. 14, 2008

(86) PCT No.: PCT/DE2008/001649
§ 371 (c)(1),
(2), (4) Date: Apr. 14, 2010

(87) PCT Pub. No.: WO2009/049592
PCT Pub. Date: Apr. 23, 2009

(65) Prior Publication Data
US 2010/0219837 A1      Sep. 2, 2010

(30) Foreign Application Priority Data
Oct. 15, 2007  (DE) .................. 10 2007 049 528

(51) Int. Cl.
*H01M 10/44*      (2006.01)

(52) U.S. Cl. ...................................................... 320/120
(58) Field of Classification Search .................. 320/116, 320/118, 119, 120, 122
See application file for complete search history.

(56) References Cited

U.S. PATENT DOCUMENTS

| | | | |
|---|---|---|---|
| 5,546,003 A * | 8/1996 | Noworolski et al. | .. 320/DIG. 18 |
| 5,825,155 A * | 10/1998 | Ito et al. | ......... 320/118 |
| 6,437,538 B1 | 8/2002 | Tsurimu et al. | |
| 6,809,502 B2 | 10/2004 | Tsujii et al. | |
| 2004/0051534 A1 | 3/2004 | Kobayashi et al. | |
| 2005/0017682 A1* | 1/2005 | Canter et al. | ................. 320/118 |
| 2007/0290674 A1 | 12/2007 | Bolz | |

FOREIGN PATENT DOCUMENTS

| | | |
|---|---|---|
| DE | 10051984 A1 | 6/2001 |
| DE | 10320127 | 12/2003 |
| DE | 10347110 | 1/2005 |
| EP | 0575205 | 1/1996 |
| EP | 1750139 | 2/2007 |

* cited by examiner

*Primary Examiner* — Edward Tso
(74) *Attorney, Agent, or Firm* — Gudrun E. Huckett

(57) ABSTRACT

The invention relates to a method and a device for measuring cell voltages of accumulator cells in a plurality of series-connected accumulator cells in a battery pack or cell pack including an Li-Ion cell pack. The method and the device are characterized in that no unbalancing of the battery pack is caused by the measurements of the cell voltages on the individual accumulator cells.

7 Claims, 1 Drawing Sheet

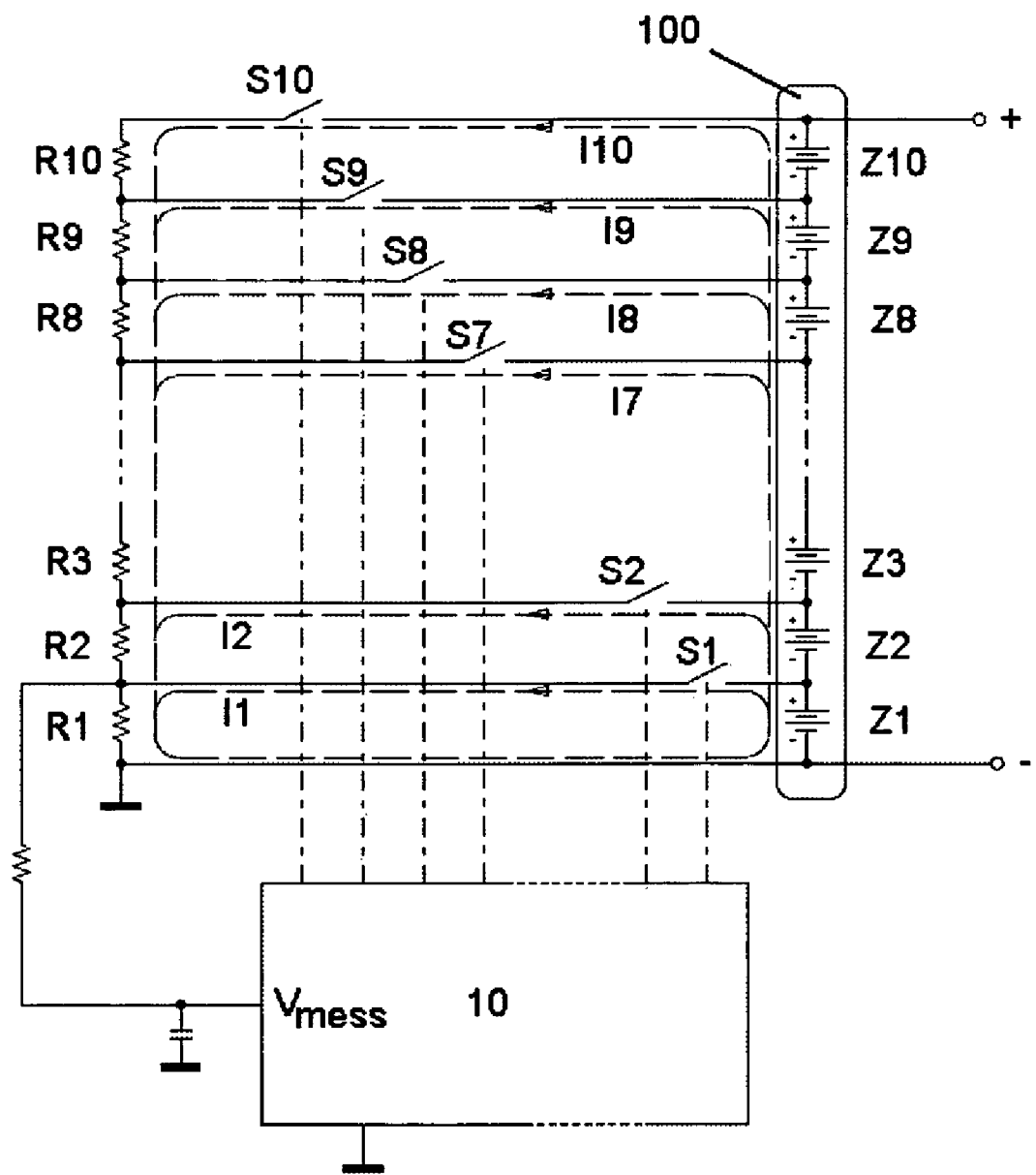

METHOD AND DEVICE FOR MEASURING CELL VOLTAGES IN A PLURALITY OF SERIES-CONNECTED ACCUMULATOR CELLS

BACKGROUND OF THE INVENTION

The invention concerns a method and a device for measuring cell voltages of accumulator cells in a plurality of series-connected accumulator cells as they are used, for example, in so-called battery packs or cell packs such as Li-ion cell packs. The invention concerns moreover a charging device for a battery pack comprising such a device.

Typical uses of these rechargeable battery packs are, for example, electric power tools, hand-held household devices, for example, vacuum cleaners, flashlights, cleaning devices, or other devices for gardening, tree and brush pruning.

Battery packs of this and other kind contain in general a plurality of series-connected individual accumulator cells. In particular in case of Li-ion battery packs there is often the need to measure the voltages across the individual series-connected (i.e. serially-connected) cells (so-called individual or cell voltage) in order to be able, for example, to determine capacitance states of the battery pack or to optimally control the charge/discharge cycles.

Measuring these cell voltages is done generally relative to a common potential, in particular, the negative terminal of the serial connection or of the battery pack. In this connection, often the problem is encountered that during the measurements of the cell voltages the individual cells are loaded at different levels and therefore become unbalanced. It has been found that, as a result of this unbalance, the effective capacitance of the battery pack may be reduced.

For example, in DE 103 47 110 a device and a method for measuring individual cell voltages in a cell stack of an energy storage device is disclosed. In this connection, parallel to each cell a serial connection of two diodes is arranged whose connecting points are connected, respectively, by a capacitor and a switch to a differential amplifier. An alternating current of a certain frequency and amplitude is applied to the capacitors and generates alternating voltage in accordance with the cell voltage that, after rectification, is converted to a ground-based direct current value for the cell voltage.

DE 103 20 127 discloses a control device and a control method for a storage battery in which, respectively, are provided a first control unit for releasing charges stored in a storage battery (capacitor) in case that the terminal voltage at the storage battery is at or above a predetermined threshold value; a temperature detection device for detecting the temperature of the storage battery; as well as a second control device that changes the predetermined threshold value as a function of the temperature of the storage battery. In that, in case of a change of the terminal voltage of the storage battery caused by a temperature change, the threshold value is also changed, an unnecessary discharge is to be prevented and the stored charge quantity is to be increased.

DE 100 51 984 discloses a battery voltage measuring device in particular for such battery cells that are combined of a plurality of series-connected modules each comprising a plurality of series-connected secondary batteries. The device comprises substantially for each module a capacitor, that is charged to the voltage of the associated module; switches that connect and disconnect this capacitor and the module; a voltage follower that outputs the voltage across the capacitor, as well as switches that connect and disconnect the voltage follower and the capacitor. In this way, the battery voltage is to be measured at high precision.

EP 1 750 139 discloses a voltage measuring device for a battery cell group that is combined of a plurality of series-connected battery cells. The measuring device comprises essentially a sampling switch for connecting one or several battery cells to be measured with a capacitor so that the latter is charged by these battery cells; a measuring component that detects and corrects the voltage at the charged capacitor as a measuring voltage so that the voltage error that is caused in the measured voltage by the connecting capacitance of the sampling switch is reduced; as well as an overvoltage protective switch that is activated immediately before switching on the sampling switch and that grounds the input terminal of the measuring component so that the measuring component is protected from overvoltage. In this way, essentially the measuring precision is to be increased and it is to be prevented that overvoltage can reach the measuring component.

Finally, US 2004/0051534 discloses a further voltage measuring device for a battery cell group that is comprised of a plurality of series-connected battery cells. A number of series-connected capacitors that are connectable by switches alternatively to different cells serve for storing the cell voltages that are supplied through analog protective switches to a voltage detector in A/D converted form. Moreover, noise suppression is provided also. In this way, the battery voltage is to be measured with minimal measuring error in a reliable way.

One object upon which the invention is based resides therefore in that a method and a device for measuring cell voltages of accumulator cells in a plurality of series-connected accumulator cells (in particular in a battery pack) are to be provided with which the unbalance of the serial cell connection that is caused by the aforementioned measurements of the cell voltages at the individual cells can be at least substantially reduced.

SUMMARY OF THE INVENTION

This object is solved with a method for measuring cell voltages of accumulator cells in a plurality of series-connected accumulator cells with a common reference potential, with a number of series-connected measuring resistors matching the number of the cells to be measured, as well as a number of switches between the measuring resistors and the cells by means of which, upon closing, one of the measuring resistors can be parallel-connected to one of the cells, comprising the following steps:

closing the switch that is connected to a first terminal of a cell to be measured as well as a further switch at a terminal of a cell that, in comparison to the cell to be measured, has a higher absolute voltage relative to the reference potential, and optionally opening all other switches;

determining and saving the voltage drop at the first terminal relative to the reference potential;

opening the switch that is connected to the first terminal of the cell to be measured and closing the switch that is connected to the second terminal of the cell to be measured;

determining and saving the voltage drop at the second terminal relative to the reference potential;

determining the cell voltage by calculating the difference of the voltages determined across the two terminals.

The object is solved furthermore with a device for measuring cell voltages of accumulator cells in a plurality of series-connected accumulator cells with a common reference potential, wherein the device comprises:

a number of series-connected measuring resistors that is matching the number of cells to be measured;

a number of switches between the measuring resistors and the cells or terminals for the cells by means of which, upon closing, one of the measuring resistors can be parallel-connected to one of the cells, respectively; as well as a measuring and control unit for opening and closing the switches as a function of a selected cell to be measured as well as for determining the cell voltage of the cell by calculating the difference of the voltage drop across the two terminals of the cell relative to the reference potential in accordance with the aforementioned method.

A special advantage of these solutions resides in that thereby an imbalance can be reduced at least to such an extent that it has, in contrast to known solutions, no longer a relevant effect on the interference immunity, the measuring precision, the sampling time, the response time, the measuring time or other parameters.

Moreover, the method according to the invention and the device according to the invention can be used for measuring the cells of battery packs with almost any number of cells.

The dependent claims contain advantageous further embodiments of the invention.

BRIEF DESCRIPTION OF THE DRAWINGS

Further details, features and advantages of the invention result from the following description of an exemplary and preferred embodiment with the aid of the drawing. It is shown in:

FIG. 1 a schematic block diagram of such a preferred embodiment of the invention.

DESCRIPTION OF PREFERRED EMBODIMENTS

In general, a device according to the invention for measuring cell voltages comprises a number of series-connected measuring resistors $Ri$ matching the number of series-connected cells $Zi$ to be measured as well as between the measuring resistors and the cells a number of switches $Si$ by means of which, upon closing, one of the measuring resistors is parallel-connected to one of the cells, respectively. The measuring resistors $Ri$ and switches $Si$ are arranged such that for each of the cells $Zi$ to be measured one measuring resistor $Ri$ can be parallel-connected, respectively, and all measuring resistors $Ri$ are series-connected.

The serial connection of the measuring resistors is parallel-connected to the serial connection of the cells, i.e., the two outer terminals of the serial connection of the measuring resistors are connected to the outer terminals of the serial connection of the cells, respectively. One of the two outer terminals of the serial cell connection (preferably the minus terminal) constitutes the reference potential for the measurements of the cell voltages across the cells so that in this connection to the relevant outer terminal of the serial connection of the measuring resistors, because of the common reference potential, no switch must be present.

For completeness it should be mentioned that this, of course, also holds true likewise when a zero potential is selected as a reference potential within the serial connection of the cells and a positive or negative voltage relative to the zero potential that is supplied by means of an appropriate third outer (for example, central) terminal is made available at the outer terminals of the serial connection so that the principle according to the invention is also applicable in this case.

The measuring resistors $Ri$ have all the same magnitude, inasmuch as the nominal voltages of the individual cells $Zi$ are also each of the same magnitude. Inasmuch as one of the cells has a higher nominal voltage than the other cells, also the measuring resistor that is parallel-connectable to this cell is to be enlarged by the same ratio in comparison to the measuring resistors of the serial connection that are parallel-connectable to the other cells.

The device according to the invention comprises furthermore a measuring and control unit with which, according to the inventive method, the switches $Si$ are opened or closed as a function of those cells whose cell voltage is to be determined in order to then calculate the cell voltage based on the measured voltage drops across one of the measuring resistors $Ri$.

In this connection, a cell voltage across one of the cells to be measured is determined by calculating the difference of those voltages that exist at the two terminals of the cell to be measured relative to the reference potential.

For determining these two voltages, preferably the (measuring) voltage drop across that one of the measuring resistors is measured that with one of its terminals (that represents also an outer terminal of the serial connection) is connected to the reference potential ("first" measuring resistor $Ri$). The two voltages at the terminals of the cell to be measured are determined by taking into account the divider ratio between the serial connection of the measuring resistors between the respective terminal of the cell to be measured and the reference potential and the first measuring resistor. This has the advantage that the measuring tap for the measuring voltage for the determination of all cell voltages across all cells can be the same (i.e., at the first measuring resistor $R1$ that is connected to the reference potential) and therefore must not be changed by means of further switches or the like.

For determining the voltage that is applied to a terminal of a cell to be measured relative to the reference potential by means of the measuring and control unit, the switch is closed that is connected to this terminal. Moreover, at least one further switch is closed at a terminal of a cell having in comparison to the cell to be measured a higher voltage relative to the reference potential, preferably the switch with the highest voltage (generally the switch at the plus terminal of the serial cell connection). In contrast to this, all other switches are open. (In supplementing this, it should be noted that in the case in which the positive terminal is selected as a reference potential, a switch at a terminal of a cell with a higher absolute voltage relative to the reference potential in comparison to the cell to be measured is closed, preferably the switch at the minus terminal of the serial cell connection).

In this way, as will be explained in more detail in the following, it is achieved that through all cells of the serial connection as well as the closed switch at the cell with the highest voltage and the serial connection of the measuring resistors connected to this switch the same measuring current flows to the reference potential while across the closed switch at the terminal of the cell to be measured no (significant) current will flow because no potential difference to the measuring resistors connected to this switch is present or could be compensated by current flow.

Further details will be explained with the aid of the embodiment of the invention illustrated in FIG. 1.

FIG. 1 shows schematically a battery pack 100 that comprises a plurality of individual accumulator cells $Zi$ each with at least approximately identical nominal cell voltage; in the illustrated case, for example, a first to a tenth cell $Z1, \ldots Z10$, that are connected in series, wherein the outer terminals of the serial connection (i.e. the positive terminal of the 10th cell Z10 or the negative terminal of the first cell Z1) constitute a plus terminal (+) and a minus terminal (−) of the battery pack 100. The minus terminal is to represent the reference potential for the measurements of the voltages.

The device according to the invention comprises a first to a tenth measuring resistor R1, ... R10 each with same resistance value that are connected in series, as well as a first to a tenth switch S1, ... S10 by means of which a connection between a positive terminal of one of the cells Z1, ... Z10 and the respective parallel-connectable measuring resistor R1, ... R10 can be realized.

Moreover, in FIG. 1 the measuring and control unit 10 is illustrated that for actuation of each switch S1, ... S10 has a switching output. The measuring and control unit 10 comprises moreover a voltage measuring input to which is applied the voltage drop $V_{mess}$ across the first measuring resistor R1 for measurement.

The measuring and control unit 10 is preferably constructed by means of a microprocessor. The switches S1, ... S10 are preferably in the form of switchable semiconductor switches, for example, bipolar transistors, MOSFETs or the like.

Finally, in FIG. 1 in dashed lines first to tenth currents I1, ... I10 are indicated that each flow to ground from the plus terminal of one of the cells Z1, ... Z10 across the (closed) switch S1, ... S10 connected thereto and the serial connection of the measuring resistors R1, ... R10 connected thereto.

For determining the cell voltage across one of the cells Z1, ... Z9, on the one hand, the switch at this cell, i.e., the (associated) switch S1, ... S9 that is connected to the plus terminal of this cell to be measured is closed.

On the other hand, at least one further switch is also closed which is provided at a cell with a higher voltage relative to the reference potential, preferably the switch at the cell with the highest voltage; in the embodiment illustrated in FIG. 1, this is thus the tenth switch S10. As a further preferred alternative, also the switches of all cells with higher voltage than that of the cell to be measured can be closed. All other switches remain open or are opened.

In the case where as the further switch the tenth switch S10 is closed, it is achieved that, based on a balanced battery pack 100, as a result of the common identical measuring current I10 through all cells Z1, ... Z10 and all measuring resistors R10, ... R1 across all cells Z1, ... Z10 the same voltages are adjusted. This has the result that the current that flows across the closed switch S1 to the cell to be measured is minimal or substantially zero. Since at any time through each cell Z1, ... Z10 the same current is flowing, no imbalance is caused by the measurement. Moreover, a potentially unbalanced state of the cells is substantially balanced by the device according to the invention.

For example, for a total nominal voltage of the battery pack 100 between the outer terminals of 40 V, closed tenth switch S10 and balanced cells, across each cell Z1, ... Z10 and across each measuring resistor R1, ... R10 a nominal voltage drop of 4 V results. When looking, for example, at the measurement of the voltage at the positive terminal of the eighth cell Z8, the voltage across the serial connection of the eighth to the first measuring resistor R8, ... R1 will not change by closing the eighth switch S8. The reason is that the voltage across the serial connection of the measuring resistors R1 to R8 and the total voltage across the cells Z1 to Z8 are of the same magnitude, respectively, in this case 8×4 V=32 V, respectively. Since by closing the eighth switch S8 no potential difference is compensated, the corresponding eighth current I8 through this eighth switch S8 is substantially equal to zero. The measuring current I10 is still passed only through the tenth switch S10 and the serial connection of the measuring resistors R10, ... R1. Since this measuring current also flows through all cells Z1, ... Z10, the battery pack 100 is not unbalanced.

The cell voltage across a certain cell Z1, ... Z10 is determined by subtraction of two measuring voltages $V_{mess}$ that drop at the first measuring resistor R1 and by taking into account the respective voltage divider ratios as a result of the measuring resistors Ri in the following way.

When, for example, the actual cell voltage across the eighth cell Z8 is to be determined, by means of the measuring and control unit 10 the eighth switch S8 and preferably, as explained above, the tenth switch S10 are closed. Subsequently, by means of the measuring and control unit 10 the voltage drop at the first measuring resistor R1, i.e., the measuring voltage $V_{mess}$, is measured and saved. Subsequently, the eighth switch S8 is opened and the seventh switch S7 is closed. Now, again by means of the measuring and control unit 10 the measuring voltage $V_{mess}$ at the first measuring resistor R1 is measured and saved.

The measuring voltage $V_{mess}$ that is measured after closing the eighth switch S8 is then multiplied by means of the measuring and control unit 10 with the voltage divider ratio (R1+R2+ ... R8)/R1 so that the sum voltage across the serial connection of the resistors R1 to R8 and thus across the cells Z1 to Z8 connected in series will result.

A corresponding calculation is also carried out for the measuring voltage $V_{mess}$ measured and saved after closing the seventh switch S7, i.e., this measuring voltage is multiplied by the voltage divider ratio (R1+R2+ ... R7)/R1 so that the voltage drop across the serial connection of the resistors R1 to R7 and the sum voltage across the cells Z1 to Z7 result.

By subtraction of these two calculated voltages from one another, the desired actual cell voltage across the eighth cell Z8 is determined finally.

The two aforementioned voltage divider ratios for all measuring voltages are saved preferably in the measuring and control unit 10 so that they must not be recalculated anew for each measurement.

The measuring and control unit 10 is preferably designed such that a user can select or input a cell to be measured and the measuring and control unit 10 then, as a function thereof, can open or close the corresponding switches and calculate and display the cell voltage present across the selected cell in accordance with the afore described method. The measuring and control unit 10 has for this purpose preferably a correspondingly programmed microprocessor unit, a memory, as well as as an input and output device.

Inasmuch as the cells Z1, ... Z10 of the battery pack 100 have different cell voltages, the resistor values of the series-connected measuring resistors R1, ... R10 are to be adjusted in accordance with the voltage ratios of the cell voltages relative to one another such that across each measuring resistor the same voltage drop occurs as in the associated cell that is parallel thereto when the tenth switch is closed and all other switches are open.

The device according to the invention advantageously can be used, for example, in combination with a charging device in order to monitor the state of the individual cells during the charging/discharging process.

What is claimed is:
1. Method for measuring cell voltages of accumulator cells in a plurality of series-connected accumulator cells with a common reference potential, comprising a number of series-connected measuring resistors matching the number of cells to be measured, as well as a number of switches between the measuring resistors and the cells by means of which, upon closing, one of the measuring resistors is connectable in parallel to one of the cells, respectively, comprising the steps:

closing the switch connected to a first terminal of a cell to be measured as well as a further switch at a terminal of a cell that, in comparison to the cell to be measured, has a higher absolute voltage relative to the reference potential, and optionally opening all other switches;

determining and saving the voltage drop at the first terminal relative to the reference potential;

opening the switch that is connected to the first terminal of the cell to be measured and closing the switch that is connected to the second terminal of the cell to be measured;

determining and saving the voltage drop at the second terminal relative to the reference potential;

determining the cell voltage by calculating the difference of the voltages determined across the two terminals.

2. Method according to claim 1, wherein in the step of determining the voltage drop at the first or the second terminal relative to the reference potential the voltage drop across a first measuring resistor of the serial connection of measuring resistors that is connected to the reference potential is measured and, based thereon, the voltage drop at the first or the second terminal is calculated, taking into account the divider ratio between the serial connection of measuring resistors positioned between the first or the second terminal and the reference potential and the first measuring resistor.

3. Method according to claim 2, wherein opening and closing of the switches calculating the voltage drops at the first or the second terminal of a cell to be measured, and calculating the cell voltage is done by a microprocessor-controlled measuring and control unit.

4. Device for measuring cell voltages of accumulators cells in a plurality of series-connected accumulators cells with a common reference potential according to the method of claim 1, the device comprising:

several series-connected measuring resistors and several cells to be measured, wherein the number of the cells matches the number of the measuring resistors;

several switches arranged between the measuring resistors and the cells or terminals of the cells such that upon closing one of the switches, respectively, one of the measuring resistors is parallel-connected to one of the cells, respectively, a measuring and control unit adapted to open and close the switches as a function of selection of a cell to be measured and adapted to determine the cell voltage of the cell to be measured by calculating the difference of the voltage drop across the two terminals of the cell to be measured relative to the reference potential.

5. Device according to claim 4, wherein the measuring and control unit comprises a computing unit and/or a memory unit for calculating and saving at least one voltage divider ratio between a serial connection of the measuring resistors connected between the first or second terminal of the cell to be measured and the reference potential and a first one of the measuring resistors that is connected to the reference potential.

6. Device according to claim 4, wherein the measuring and control unit comprises a microprocessor unit and a memory adapted to detect and save the measuring voltage existing at its input, to open and close the switches as a function of a selection by a user of the cell to be measured, and to calculate the cell voltage.

7. Charging device comprising a device according to claim 4.

* * * * *